United States Patent
Hashimoto

(10) Patent No.: US 10,026,873 B2
(45) Date of Patent: Jul. 17, 2018

(54) METHOD OF MANUFACTURING LIGHT EMITTING DEVICE

(71) Applicant: NICHIA CORPORATION, Anan-shi, Tokushima (JP)

(72) Inventor: Toru Hashimoto, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/827,070

(22) Filed: Nov. 30, 2017

(65) Prior Publication Data

US 2018/0083167 A1  Mar. 22, 2018

Related U.S. Application Data

(63) Continuation of application No. 15/455,303, filed on Mar. 10, 2017, now Pat. No. 9,859,472.

(30) Foreign Application Priority Data

Mar. 14, 2016 (JP) .................................. 2016-049506

(51) Int. Cl.

| | |
|---|---|
| *H01L 21/00* | (2006.01) |
| *H01L 33/48* | (2010.01) |
| *H01L 33/50* | (2010.01) |
| *H01L 33/60* | (2010.01) |
| *H01L 33/62* | (2010.01) |
| *H01L 33/54* | (2010.01) |

(52) U.S. Cl.
CPC .......... *H01L 33/486* (2013.01); *H01L 33/507* (2013.01); *H01L 33/54* (2013.01); *H01L 33/60* (2013.01); *H01L 33/62* (2013.01); *H01L 2933/005* (2013.01); *H01L 2933/0033* (2013.01); *H01L 2933/0041* (2013.01); *H01L 2933/0058* (2013.01); *H01L 2933/0066* (2013.01)

(58) Field of Classification Search
CPC ..... H01L 33/486; H01L 33/507; H01L 33/54; H01L 33/62
USPC ........................................................ 438/27
See application file for complete search history.

(56) References Cited

U.S. PATENT DOCUMENTS

| | | |
|---|---|---|
| 9,647,171 B2 | 5/2017 | Rogers et al. |
| 2005/0121813 A1 | 6/2005 | Asai et al. |
| 2009/0215349 A1 | 8/2009 | Sakurai |
| 2013/0033169 A1 | 2/2013 | Ito et al. |

FOREIGN PATENT DOCUMENTS

| | | |
|---|---|---|
| JP | 57-091274 A | 6/1982 |
| JP | 2001-093920 A | 4/2001 |
| JP | 2005-116591 A | 4/2005 |
| JP | 2010-219324 A | 9/2010 |
| JP | 2012-227470 A | 11/2012 |
| JP | 2012-253223 A | 12/2012 |
| JP | 2013-038187 A | 2/2013 |
| JP | 2013-077679 A | 4/2013 |
| WO | 2015193763 A1 | 12/2015 |

*Primary Examiner* — David S Blum

(57) ABSTRACT

A method of manufacturing a light emitting device includes: mounting at least one light emitting element on a support member with a first surface of the light emitting element facing upward; applying an adhesive to the first surface of the light emitting element by holding the support member and dipping the first surface of the light emitting element in the adhesive; and disposing a light-transmissive member on the first surface of the light emitting element via the adhesive.

16 Claims, 10 Drawing Sheets

METHOD OF MANUFACTURING LIGHT EMITTING DEVICE

CROSS-REFERENCE TO RELATED PATENT APPLICATION

This application is a continuation application of U.S. patent application Ser. No. 15/455,303, now U.S. Pat. No. 9,859,472, filed on Mar. 10, 2017. The present application claims priority to Japanese Patent Application No. 2016-049506, filed on Mar. 14, 2016. The entire disclosures of U.S. patent application Ser. No. 15/455,303 and Japanese Patent Application No. 2016-049506 are hereby incorporated herein by reference.

BACKGROUND

1. Technical Field

The present disclosure is related to methods of manufacturing light emitting devices.

2. Description of Related Art

In order to realize a chip size package (CSP), in which a total size of the package is close to the size of the light emitting element chip, a light emitting device in which the number of constituting components of the package is reduced and the manufacturing processes are simplified has been proposed (for example, in Japanese Unexamined Patent Application Publication No. 2012-227470).

SUMMARY

Improvement in the luminance or luminous flux expected in other types of light emitting devices is also expected in such chip size packages, with a need of further simplification in manufacturing processes. The present invention is devised in the light of such circumstances, and it is hence an object thereof to provide a light emitting device in which occurrence of detachment can be suppressed.

A method of manufacturing a light emitting device includes: mounting at least one light emitting element on a support member with a first surface of the light emitting element facing upward; applying an adhesive to the first surface of the light emitting element by holding the support member and dipping the first surface of the light emitting element in the adhesive; and disposing a light-transmissive member on the first surface of the light emitting element via the adhesive.

According to the present disclosure, a simplified method of manufacturing a light emitting device can be realized.

DETAILED DESCRIPTION

Figure 1A:
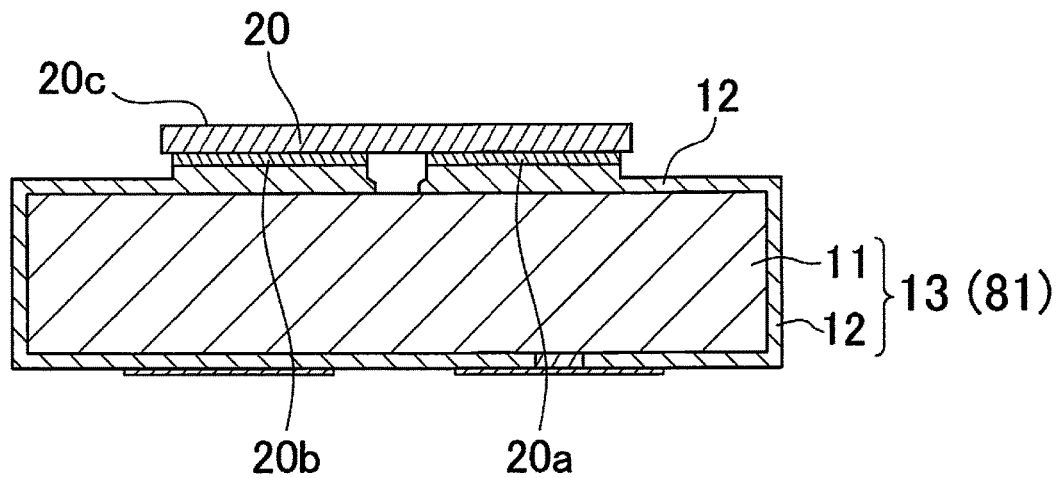
FIG. 1A is a schematic cross-sectional view illustrative of a method of manufacturing a light emitting device according to one embodiment of the present invention.

Hereinafter, embodiments of the present invention will be described with reference to the drawings as appropriate. It is to be noted that the light emitting device described below is intended for implementing the technical concept of the present invention, and the present invention is not limited to those described below unless otherwise specified. Matters described in one embodiment and example are applicable to other embodiments and examples. The size or positional relationship of the members shown in the drawings may be exaggerated for the sake of clarity.

First Embodiment

Figure 1B:
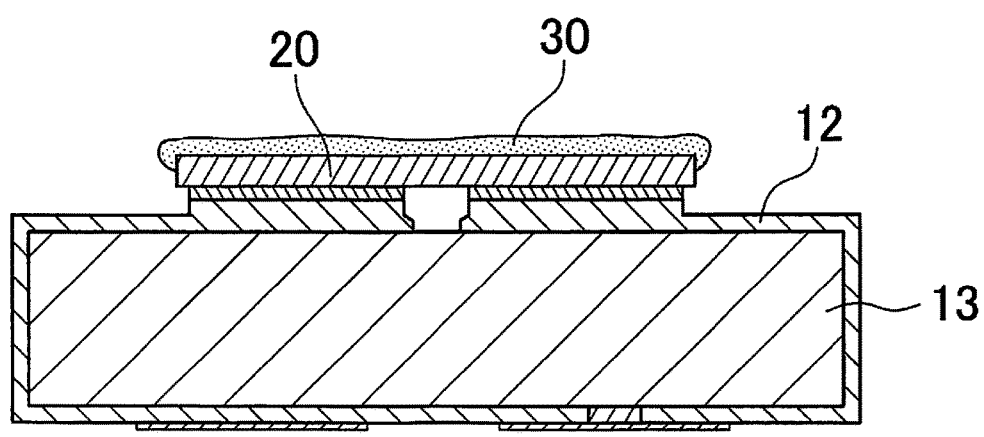
FIG. 1B is a schematic cross-sectional view illustrative of a method of manufacturing a light emitting device according to one embodiment of the present invention.
Figure 1C:
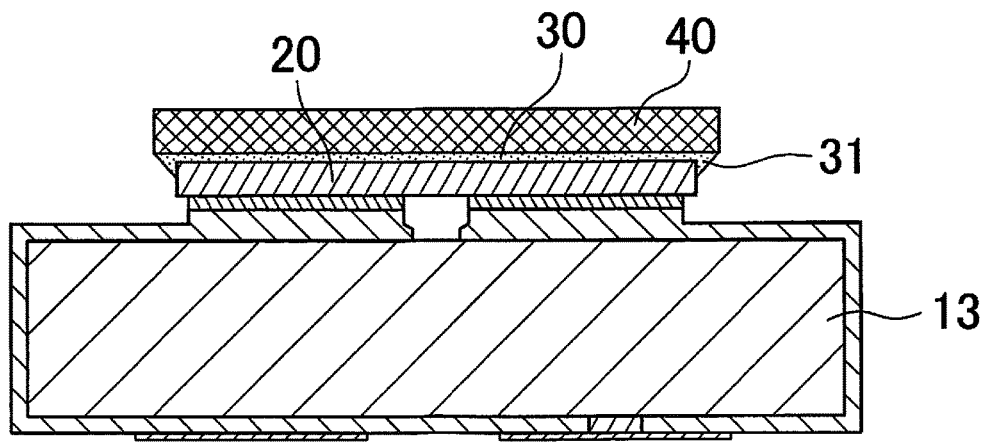
FIG. 1C is a schematic cross-sectional view illustrative of a method of manufacturing a light emitting device according to one embodiment of the present invention.

A method of manufacturing a light emitting device according to a first embodiment mainly includes, as shown in FIGS. 1A to 1E, and FIG. 2, mounting a light emitting element 20 on a wiring substrate 13 that is configured to serve as a support member 81, with a first surface of the light emitting element facing upward (FIG. 1A), applying an adhesive 30 to the first surface 20c of the light emitting element 20 by holding the support member 81 and dipping the first surface 20c of the light emitting element 20 in an adhesive 30 (FIGS. 2A to 2C) and allowing the adhesive 30 adhered to the first surface 20c of the light emitting element 20 (FIG. 1B), and disposing a light-transmissive member 40 on the first surface 20c of the light emitting element 20 via the adhesive 30 (FIG. 1C). The method will be described in more detail below.

First, as shown in FIG. 1A, when a wiring substrate 13 is used as a support member 81, a light emitting element 20 is mounted in a flip-chip configuration on the wiring substrate 13.

A wiring substrate 13 and a light emitting element 20 are provided, then, electrodes 20a, 20b of the light emitting element 20 are placed facing corresponding portions of a wiring 12 in an element-mounting part of the wiring substrate 13, and an electrically conductive member, for example, a gold-tin eutectic solder is disposed between the electrodes 20a, 20b and the wiring 12. Then by using a technique such as reflow-soldering, ultrasonic bonding, or thermo-compression bonding, the light emitting element 20 and the wiring substrate 13 can be bonded. Thus, via the electrically conductive member, the light emitting element 20 can be mounted in a flip-chip configuration on the element-mounting part of the wiring substrate 13.

Figure 2A:
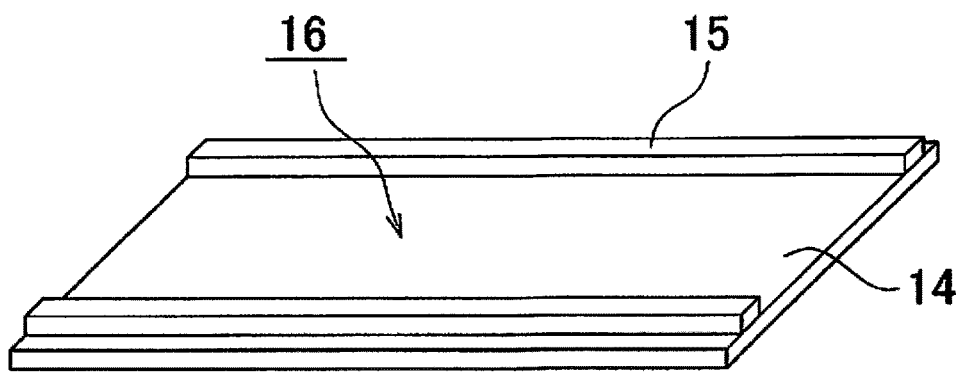
FIGS. 2A to 2C are schematic perspective views illustrative of a dipping step in a method of manufacturing a light emitting device according to the present invention.
Figure 2B:
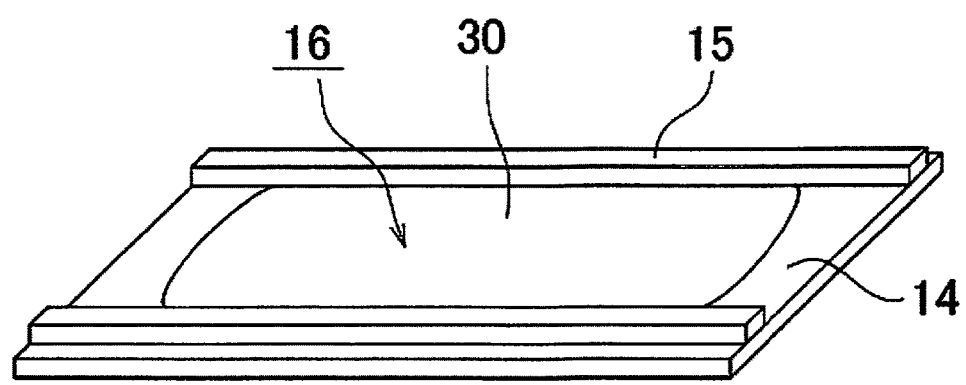

Subsequently, the first surface 20c of the light emitting element 20 mounted on the wiring substrate 13 is dipped in an adhesive 30. As shown in FIG. 2A, a dam material such as a plastic tape 15 is attached on a surface of a substrate 14 for holding an adhesive at predetermined locations spaced apart from each other to make an adhesive-holding vessel 16 as shown in FIG. 2B. The plastic tape 15 is not necessarily applied along the entire periphery of the adhesive-holding vessel 16, but may be applied along one side or two sides, or a part of the periphery of the adhesive-holding vessel 16 so that a flow or movement of the adhesive 30 can be prevented.

Figure 2C:
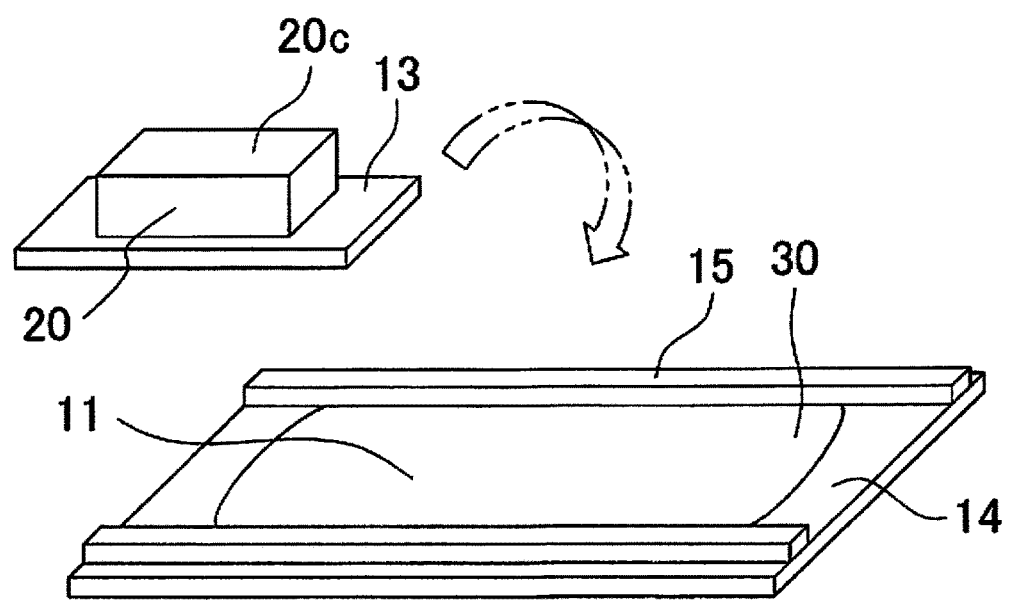

Subsequently, as shown in FIG. 2C, the wiring substrate 13 having the light emitting element 20 mounted thereon is held with the first surface 20c of the light emitting element 20 facing downward, and then, the first surface 20c of the light emitting element 20 is dipped in the adhesive 30 in the adhesive-holding vessel 16. With this, the wiring substrate 13 and the adhesive 30 are not made in contact to each other, so that adhesion of the adhesive 30 on the wiring substrate 13 or contamination of the wiring substrate 13 due to the adhesive 30 can be avoided. An appropriate amount of the adhesive can be made attached to the first surface 20c of the light emitting element 20 by adjusting the viscosity of the adhesive 30 that also can adjust the degree of drooping caused by gravitational force, and a lifting speed after dipping. Further, when the wiring substrate 13 is returned to the first orientation (that is, the wiring substrate 13 is at a lower side and the light emitting element 20 is at the upper side, and the first surface 20a with the adhesive 30 attached thereon faces upward), as shown in FIG. 1B, the adhesive 30 is moderately protruded upward by its surface tension on the first surface 20c of the light emitting element 20. The adhesive 30 may be provided only on the first surface 20c of the light emitting element 20 or drooped down from the first surface 20c onto the lateral surfaces of the light emitting element 20. When the adhesive 30 is provided also onto the lateral surfaces, the amount of the adhesive 30 is adjusted so that an excessive drooping of the adhesive 30 onto the lateral surfaces can be prevented and an appropriate amount of the adhesive 30 can be provided, thus, a resin fillet 31 of suitable shape can be formed.

Then, as shown in FIG. 1C, via the adhesive 30, a light-transmissive member 40 is disposed on the first surface 20c of the light emitting element 20. With this arrangement, the light-transmissive member 40 can be fixed to the first surface 20c of the light emitting element 20. At this time, with the weight of the light-transmissive member 40 or an additional slight downward pressing force, the adhesive 30 is pressed downward. With an appropriate amount of the adhesive 30 and the surface tension of the adhesive 30, the adhesive can spread substantially uniformly on the first surface 20c of the light emitting element 20. Thus, strong adhesion of the light-transmissive member 40 can be securely obtained on the whole of the first surface 20c of the light emitting element 20. Also, when the adhesive 30 is provided only on the first surface 20c of the light emitting element 20, pressing the adhesive 30 can allow a portion of the adhesive 30 drooped down onto the side surfaces of the light emitting element 20, so that the resin fillet 31 can be formed at least on some lateral surfaces. With such an arrangement of the resin fillet 31 made of the adhesive 30, portion of light emitted from the light emitting element 20 in lateral directions can be efficiently reflected upward by an outer surface of the resin fillet 31, thus, higher brightness and higher luminous flux can be expected to achieve. In order to suitably form the resin fillet 31, the area of the first surface 20c of the light emitting element 20 is preferably at most twice the total area of the lateral surfaces (a sum of the areas of all the lateral surfaces) of the light emitting element 20.

When the area of the first surface 20c of the light emitting element 20 is greater than twice the total area of the lateral surfaces (a sum of the areas of all the lateral surfaces) of the light emitting element 20, the adhesive 30 drooped down from the first surface 20c onto the lateral surface(s) may reach the wiring substrate 13. If the adhesive 30 is allowed to droop down and reaches the wiring substrate 13, light emitted from the light emitting element 20 may be irradiated on the wiring substrate 13 through the adhesive 30 and the light may be absorbed by the wiring substrate 13. For this reason, the adhesive 30 is preferably not in contact with the wiring substrate 13.

The amount of the adhesive 30 disposed (in other words, the adhered mass of the adhesive 30) on the lateral surfaces of the light emitting element 20 can also be adjusted by the dipping depth. The adhered mass of the adhesive 30 can also be adjusted by adjusting the thickness of the adhesive 30 in the adhesive-holding vessel 16, which is adjusted by the thickness of the dam material.

The light-transmissive member 40 and the light emitting element 20 can be fixed by curing the adhesive 30. The curing may be done either by heating or by irradiation of ultraviolet rays or the like.

The adhesive 30 may be adhered to lateral surfaces of the light-transmissive member 40. In this case, light can be reflected around the interfaces of the lateral surfaces of the light-transmissive member 40 and the adhesive 30, which can contribute to improvement in the light extraction efficiency.

Figure 1D:
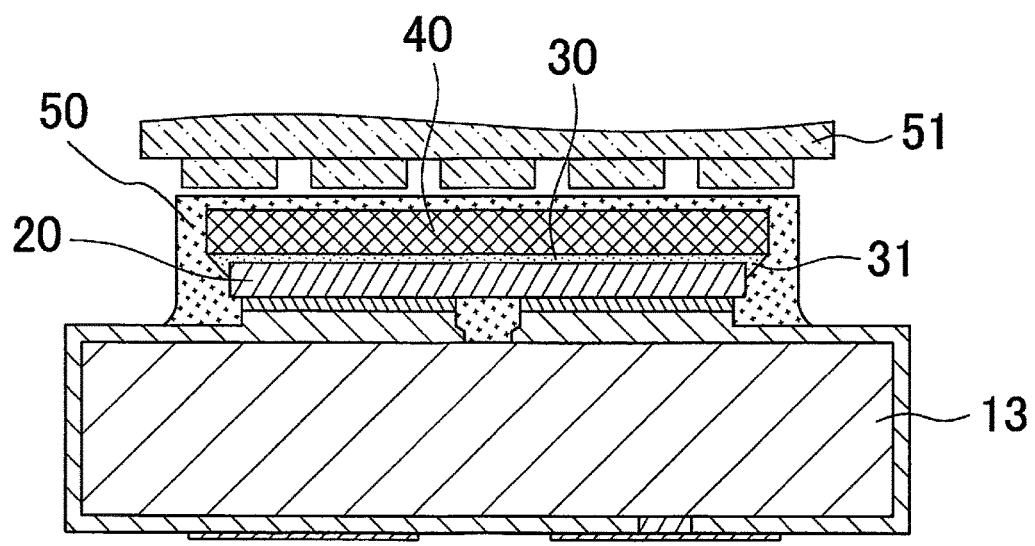
FIG. 1D is a schematic cross-sectional view illustrative of a method of manufacturing a light emitting device according to one embodiment of the present invention.

After fixing the light-transmissive member 40 to the first surface 20c of the light emitting element 20, for example as shown in FIG. 1D, a light-reflecting member 50 is preferably arranged on the wiring substrate 13 and around the light emitting element 20. With this arrangement, the front luminance can be improved and the light emitting device of a smaller size can be realized. The light-reflecting member 50 is preferably also disposed between a lower surface of the light-reflecting member 20 and an upper surface of the wiring substrate 13.

The light-reflecting member 50 can be disposed by using a potting method, a transfer molding method, a printing method, a compression molding method, or the like. When the light-reflecting member 50 is disposed by using a method as described above, the light-reflecting member 50 may be disposed not only around the light emitting element 20 but also on the lateral surfaces and/or the upper surface of the light-reflecting member 40. If the light-reflecting member 50 is disposed on the upper surface of the light-transmissive member 40, for example as shown in FIG. 1D, the light-reflecting member 50 is preferably removed by polishing or the like, by using a grinding machine, a grinding wheel 51, or the like. The light-reflecting member 50 preferably covers portions of the lateral surfaces of the light-transmissive member 40, more preferably covers whole lateral surfaces of the light-transmissive member 40. The light-reflecting member 50 can be applied to cover and in contact with the light-transmissive member 40 or, as described above, to cover the light-transmissive member 40 and the light emitting element 20 via the adhesive 30.

Figure 1E:
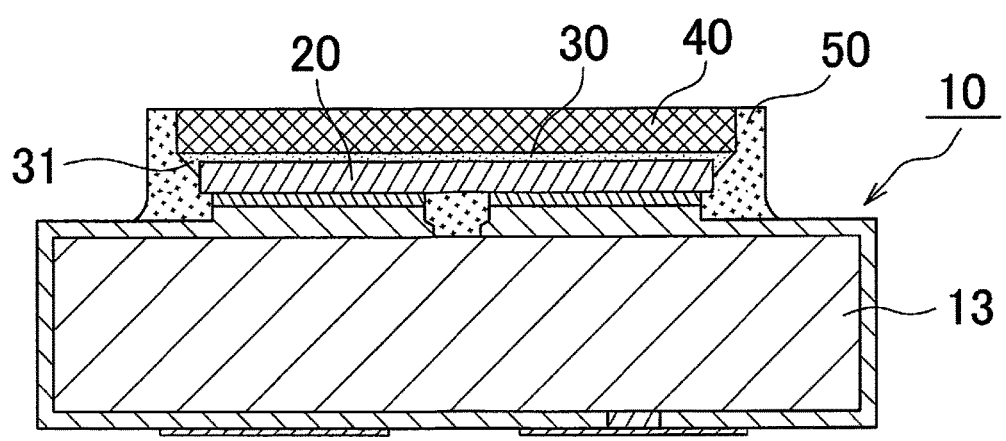
FIG. 1E is a schematic cross-sectional view illustrative of a method of manufacturing alight emitting device according to one embodiment of the present invention.

As shown in FIG. 1E, the light-reflecting member 50 disposed as described above can facilitate manufacturing of the light emitting device 10 in which portions or the whole of the lateral surfaces of the light emitting element 20 and the light-reflecting member 40 are covered by the light-reflecting member 50 while having the resin fillet 31 of the adhesive 30.

Second Embodiment

A method substantially similar to that in the first embodiment can be employed except for a plurality of light emitting elements 20 is mounted.

Figure 3A:
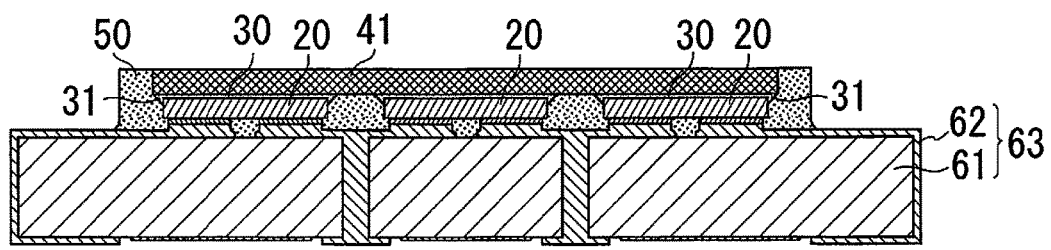
FIG. 3A is a schematic cross-sectional view illustrative of a method of manufacturing a light emitting device according to another embodiment of the present invention.
Figure 3B:
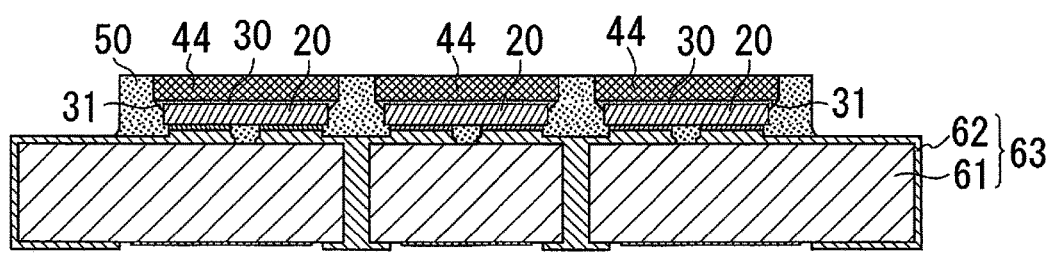
FIG. 3B is a schematic cross-sectional view illustrative of a light emitting device according to still another embodiment of the present invention.

As illustratively shown in FIG. 3A and FIG. 3B, three light emitting elements 20 may be employed and mounted in a flip-chip configuration on a single wiring substrate 63 that includes a base member 61 and wirings 62 arranged thereon.

After dipping the first surfaces 20c of the light emitting elements 20 into the adhesive 30, a single light-transmissive member 41 may be disposed on the three light emitting elements 20, or three light-transmissive members 44 may be disposed on the three light emitting elements 20, respectively.

Then, similar to that in the first embodiment, a light-reflecting member 50 is disposed to cover the outer peripheries of the light emitting elements 20, between the light emitting elements, under each of the light emitting elements, and lateral surfaces of the light-transmissive member 41 or the light-transmissive members 44.

Third Embodiment

Figure 4A:
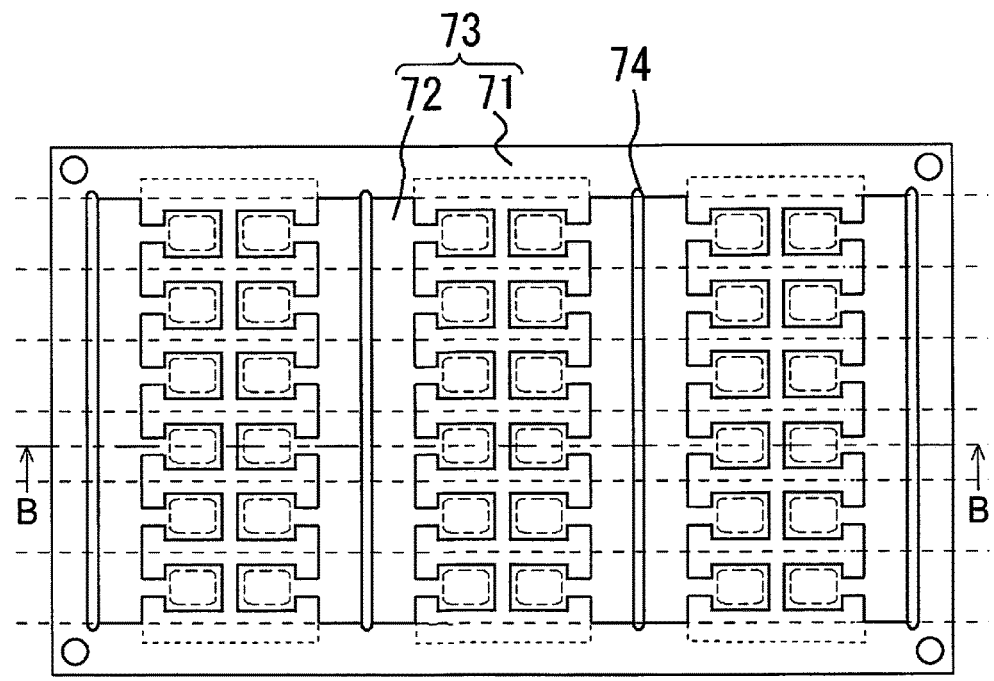
FIG. 4A is a schematic plan view of a collective substrate used in a method of manufacturing a light emitting device according to still another embodiment of the present invention.
Figure 4B:
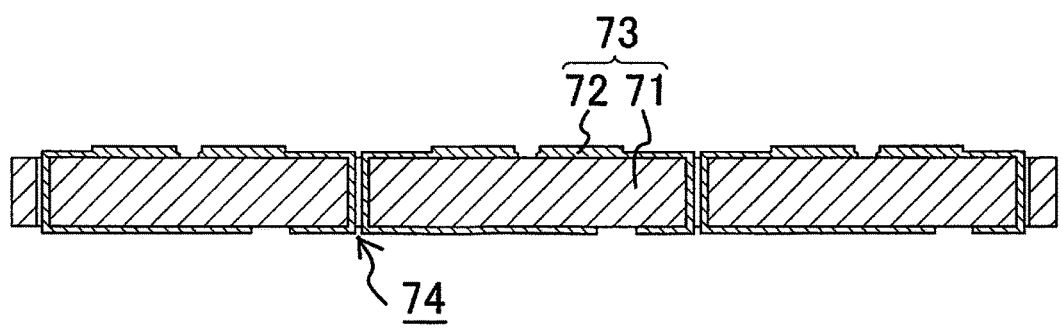
FIG. 4B is a sectional view taken along line B-B' of FIG. 4A.
Figure 5A:
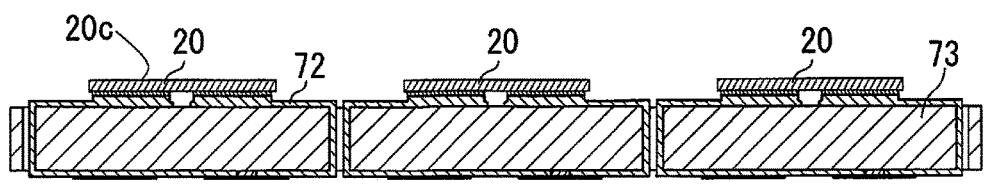
FIG. 5A is a schematic cross-sectional view illustrative of a method of manufacturing a light emitting device according to one embodiment, in which the collective substrate shown in FIGS. 4A and 4B is used.

As shown in FIG. 4A and FIG. 4B, a plurality of wiring substrates may be provided in a form of a collective substrate 73, in which a plurality of wirings 72 is arranged on a single base member 71 so that a plurality of wiring substrates is continuously arranged. The collective substrate 73 includes a plurality of wiring substrates arranged in a matrix manner, for example, a plurality of longitudinally extending slits 74 is formed so that laterally adjacent wiring substrates are formed to be separated from each other. In this case, as shown in FIG. 4A and FIG. 5A, a plurality of light emitting elements 20 is mounted in a flip-chip manner, respectively bridging two adjacent wirings 72 on the collective substrate 73.

Then, as in the first embodiment, all the first surfaces 20c of the plurality of light emitting elements 20 are dipped at once in the adhesive 30.

Figure 5B:
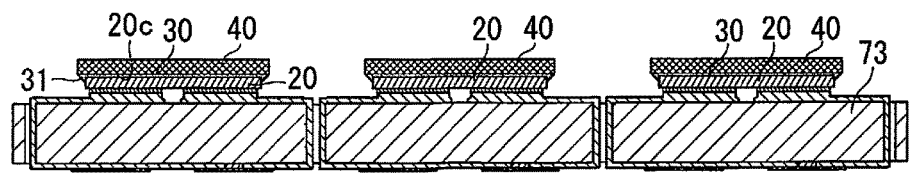
FIG. 5B is a schematic cross-sectional view illustrative of a method of manufacturing a light emitting device according to one embodiment, in which the collective substrate shown in FIGS. 4A and 4B is used.

Then, as in the first embodiment, as shown in FIG. 5B, via the adhesive 30, a light-transmissive member 40 is fixed on the first surface 20c of each of the light emitting elements 20.

Figure 5C:
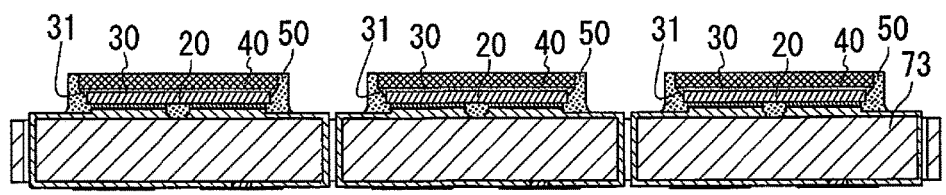
FIG. 5C is a schematic cross-sectional view illustrative of a method of manufacturing a light emitting device according to one embodiment, in which the collective substrate shown in FIGS. 4A and 4B is used.

Subsequently, as in the first embodiment, as shown in FIG. 5C, the light-reflecting member 50 is disposed at once on all of the plurality of light emitting elements 20. Then, along the locations indicated by the broken lines in FIG. 4A, each of the light emitting elements 20 are singulated. The singulation may be performed for each of a plurality of groups of the light emitting elements 20. Also, for example, arranging the slits 74 each extending in a longitudinal direction in the collective substrate 73 allows singulating with only lateral cuttings, thus can facilitate singulation of each of the light emitting devices.

According to the method of manufacturing as described above, mass-manufacturing of the light emitting devices can be facilitated.

Fourth Embodiment

A method of manufacturing a light emitting device according to a fourth embodiment includes, as shown in FIGS. 6A to 6E, mounting a plurality of light emitting elements 20 on a support member 81 with a first surface 20a of each of the plurality of light emitting elements 20 respectively facing upward (FIG. 6A), applying an adhesive 30 to the first surfaces 20c of the plurality of light emitting elements 20 by holding the support member 81 and dipping the first surfaces 20c of all of the plurality of light emitting elements 20 at once in the adhesive 30, in a similar manner as shown in FIGS. 2A to 2C and allowing the adhesive 30 adhered to the first surfaces 20c of the plurality of light emitting elements 20; and mounting the plurality of light emitting elements 20 on, for example, a sheet-shaped light-transmissive member 45 (FIG. 6B) via the adhesive 30 (FIG. 1C). The method will be described in more detail below.

First, a single support member 81 and a plurality of light emitting elements 20 are provided.

Figure 6A:
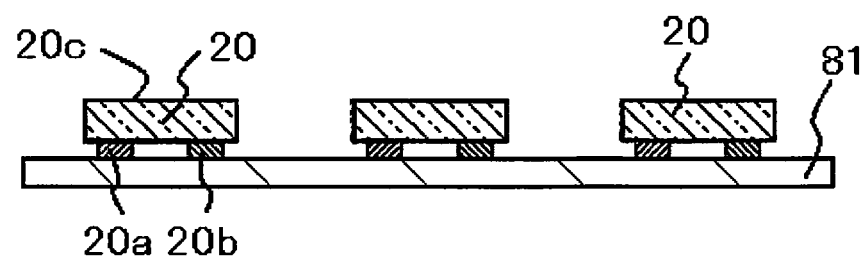
FIGS. 6A to 6E are schematic plan views illustrative of a method of manufacturing a light emitting device according to another embodiment of the present invention.

Then, as shown in FIG. 6A, the plurality of the light emitting elements 20 are mounted with their electrodes 20a, 20b facing the support member 81. In this case, the first surface of the support member 81 preferably has an adhesion layer or the like. The support member 81 is preferably an adhesive tape, for example. Thus, when the support member 81 is moved or turned over, the plurality of light emitting elements 20 can be held in respective places.

Figure 6B:
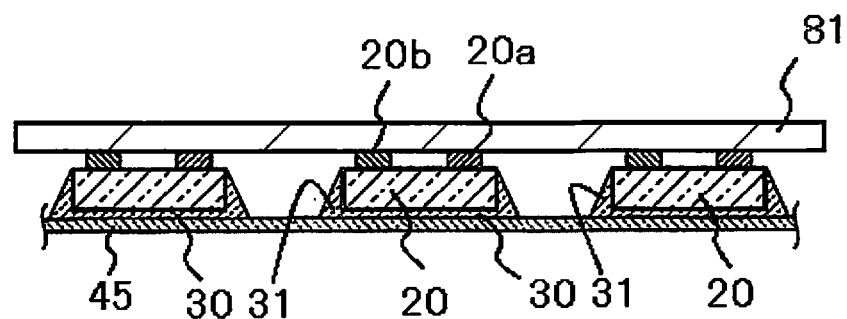

Then, as shown in FIGS. 2A to 2C, the support member 81 having the light emitting elements 20 mounted thereon is held so that the first surfaces 20c of the light emitting elements 20 face downward, and the first surfaces 20c are dipped in the adhesive 30, to attach the adhesive 30 on the first surfaces 20c of the light emitting elements 20. Then, with the first surfaces 20c having the adhesive 30 attached thereon facing downward, as shown in FIG. 6B, the light emitting elements 20 are placed on a sheet-shaped light-transmissive member 45. At this time, the adhesive 30 is adequately pushed by the weights of the support member 81 and corresponding light emitting element 20, so that an appropriate amount of the adhesive 30 can be uniformly spread on the first surfaces 20c of the light emitting elements 20. At the same time, a portion of adhesive 30 at each of the light emitting elements 20 may rise onto lateral surfaces of the corresponding light emitting element 20, and the resin fillet 31 of an appropriate volume and shape can be formed on each of the light emitting elements 20.

Subsequently, the adhesive 30 is cured and the light-transmissive member 40 and the light emitting element 20 can be fixed.

Figure 6C:
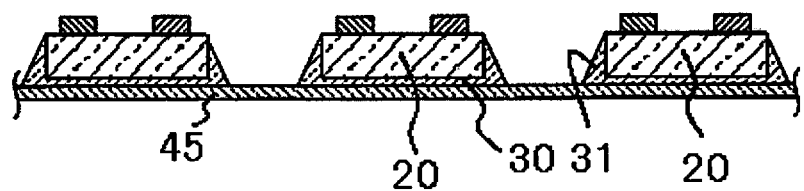

Subsequently, as shown in FIG. 6C, the support member 81 is removed.

Figure 6D:
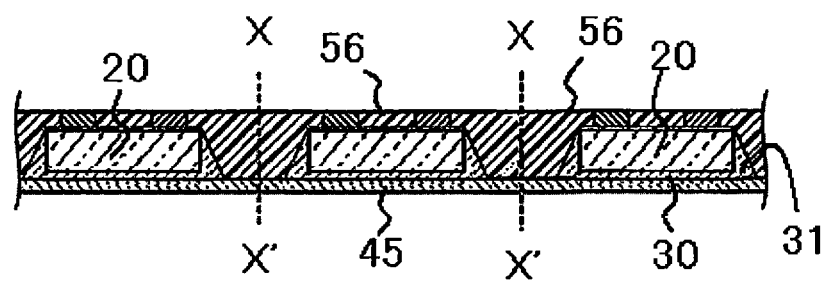

Then, as shown in FIG. 6D, a light-reflecting member 56 is disposed around the plurality of the light emitting elements 20. The light-reflecting member 56 is preferably disposed also between the electrodes 20a, 20b at a lower surface-side of each of the plurality of light emitting elements 20.

Figure 6E:
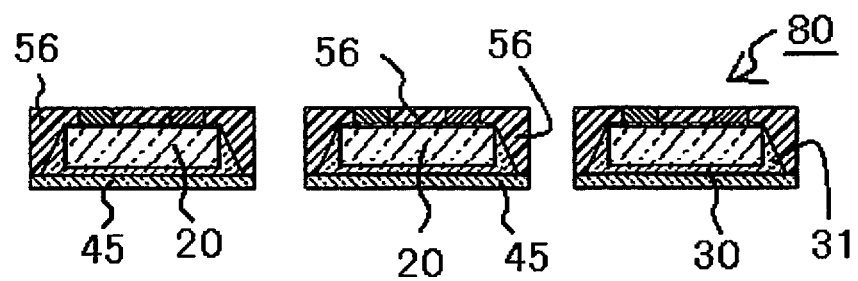

Then, along the X-X' lines in FIG. 6D, singulating is carried out for each of the light emitting elements 20. Thus, the light emitting devices 80 as shown in FIG. 6E can be manufactured simply and easily.

Each constituting component used in the method of manufacturing light emitting device according to the present disclosure will be described below.

Support Member 81

The support member 81 can be made of any material and/or configuration that allow appropriate supporting of a predetermined number of the light emitting elements 20.

For example, as shown in FIG. 6A, the support member 81 of a plate-like shape can be employed. The support member 81 can be made of one or more materials selected from resins (may be a fiber reinforced resin), ceramics, glass, metal, paper, and a composite material of those. For example, an adhesive tape having an adhesive layer provided on a plastic sheet, used in the fields of manufacturing semiconductors can be employed.

The support member 81 may be removed during manufacturing of the light emitting device, or for example, as shown in FIG. 1A, the wiring substrate 13 that includes the base member 11 and wirings 12 may be used as the support member 81. The wiring substrate 13 is electrically connected to the light emitting element 20 and serves as the wiring substrate of the light emitting device.

Base Member 11 (61, 71)

The base member 11 can be formed by using resin (may be a fiber reinforced resin), ceramics, glass, a metal, paper, or the like, for example. Examples of the resin include epoxy resins, glass epoxy resins, bismaleimide triazine (BT) resins, and polyimide resins. Examples of the ceramics include aluminum oxide, aluminum nitride, zirconium oxide, zirconium nitride, titanium oxide, titanium nitride, and a mixture of two or more of those. Examples of the metal include copper, iron, nickel, chromium, aluminum, silver, gold and titanium or an alloy of two or more of those metals. When the base member 11 is a flexible substrate, a base material such as, polyimide, polyethylene terephthalate, polyethylene naphthalate, liquid crystal polymer, cycloolefin polymer, or the like, can be used. Of those base materials, a material or materials having a linear expansion coefficient similar to the linear expansion coefficient of the light emitting elements 20 are preferably used.

Wiring 12 (62, 72)

The positive and negative wirings 12 are respectively arranged at least on an upper surface of a base member 11, and may also be arranged in the base member 11, and/or on one or more lateral surfaces and/or a lower surface of the base member 11. With respect to each of the light emitting elements 20, the positive and negative wirings 12 preferably respectively have a mounting portion for mounting the light emitting element, a terminal portion configured to establishing external connection, and a lead-wiring portion configured to connect those portions. The wirings 12 can be made of copper, iron, nickel, tungsten, chromium, aluminum, silver, gold, titanium, palladium, rhodium, or an alloy of two or more of those metals. The wirings 12 can either be a single layer or a multilayer made of one or more of those metals or alloys. Particularly, copper or a copper alloy is preferred in view of heat dissipation performance. In view of wettability of a bonding member and/or light-reflecting properties, surfaces of the wirings 12 may be provided with a layer made of silver, platinum, aluminum, rhodium, gold or an alloy of two or more of those metals.

Light Emitting Element 20

The light emitting element 20 has at least a semiconductor element structure and in many cases further has a substrate. For the light emitting element 20, any of those known as light emitting diode chip can be used. The light emitting element 20 preferably has an approximately rectangular shape, particularly a square shape or a rectangular shape elongated in a top view. The light emitting element 20 preferably has positive and negative (p- and n-) electrodes on a same surface side. Either a single or a plurality of light emitting elements 20 may be carried on a single light emitting device. The plurality of light emitting elements 20 can be electrically connected either in series or in parallel.

For example, the emission wavelength of the light emitting element 20 can be selected from ultraviolet to infrared range by the semiconductor materials and the mixed crystal ratio thereof. The emission wavelength of the light emitting element 20 is preferably in a range of 400 nm to 530 nm, more preferably in a range of 420 nm to 490 nm, in view of luminous efficiency of the light emitting element and excitation efficiency of fluorescent material and mixed light colors of the emissions of the light emitting element and the fluorescent material. Examples of the semiconductor materials include nitride-based semiconductors (typically represented by $In_xAl_yGa_{1-x-y}N$, $0 \leq x$, $0 \leq y$, $x+y \leq 1$), InAlGaAs-based semiconductors, InAlGaP-based semiconductors, zinc sulfide, lead selenide, and silicon carbide.

The light emitting element 20 can be mounted in a flip-chip manner in which positive and negative electrodes of the light emitting element 20 are respectively electrically connected to corresponding wirings of the base member 11 via an electrically conductive member. Examples of the electrically conductive member include bumps made of gold, silver, or copper, a metal paste including a metal powder of silver, gold, copper, platinum, aluminum, or palladium and a resin binder, solders such as tin-bismuth-based solders, tin-copper-based solders, tin-silver-based solders, gold-tin-based solders, brazing materials such as low-melting-point metals.

Adhesive 30

For the adhesive 30, an appropriate known adhesive can be used. Specific examples of the adhesive 30 include silicone resin, epoxy resin, phenol resin, polycarbonate resin, acrylic resin, or modified resin thereof or hybrid resin thereof. Among those, silicone resin, modified resin thereof, and hybrid resin thereof are preferable because they have good heat-resisting properties and light-resisting properties.

When the adhesive 30 is adhered on the surfaces of the light emitting elements by dipping the surfaces of the light emitting elements 20 in the adhesive 30, an adhesive 30 can be used either in situ or diluted in an organic solvent etc. More specifically, when a silicone resin is used, an organic solvent such as hexane or toluene is preferably used. In order to adhere an appropriate amount of the adhesive on the first surfaces of the light emitting elements 20 and to adhere an appropriate amount of the adhesive 30 on the lateral surfaces of the light emitting elements 20 and/or the light-transmissive member 40, the viscosity of the adhesive 30 for dipping is preferably in a range of 1 to 100 Pa·s, more preferably in a range of 5 to 50 Pa·s, and about 10 Pa·s is further more preferable.

Light-Transmissive Member 40 (41, 44, 45)

The light-transmissive member 40 having light-transmissive properties to the light emitted from the light emitting element(s) 20 (for example, an optical transmittance of 50% or greater, preferably 70% or greater, more preferably 85% or greater) can be employed, and the light-transmissive member 40 may be made of a light-transmissive base member or may include a light-transmissive base member and a fluorescent material. The light-transmissive member 40 may be made solely of a fluorescent material.

Fluorescent Material

The fluorescent material absorbs at least a part of primary light emitted from the light emitting element(s) 20 and emits secondary light having different wavelength than that of the primary light. Accordingly, the light emitting device that can emit mixed-color light (for example, white light) of the primary light of visible wavelength and the secondary light of visible wavelength can be obtained. For the fluorescent material, one type of fluorescent material may be singly used, or two or more types of fluorescent materials may be used in combination. Specific examples of the fluorescent material include a yttrium-aluminum-garnet-based fluorescent material (for example, $Y_3(Al,Ga)_5O_{12}:Ce$), a lutetium-aluminum-garnet-based fluorescent material (for example $Lu_3(Al,Ga)_5O_{12}:Ce$), a silicate-based fluorescent material (for example $(Ba, Sr)_2SiO_4:Eu$), a chlorosilicate-based fluorescent material (for example $Ca_8Mg(SiO_4)_4Cl_2:Eu$), and a β-sialon-based fluorescent material (for example $Si_{6-z}Al_zO_zN_{8-z}:Eu$ ($0<Z<4.2$)), a nitrogen-containing calcium aluminosilicate (CASN or SCASN)-based fluorescent material (for example, $(Sr, Ca)AlSiN_3:Eu$), and a potassium fluosilicate-based fluorescent material (for example, $K_2SiF_6:Mn$).

The fluorescent material may include quantum dots. The quantum dots are particles having the particle size in a range of about 1 nm to about 100 nm, whose emission wavelength can be changed according to the particle size. Specific examples of the quantum dots include CdSe, CdTe, ZnS, CdS, PbS, PbSe, $AgInS_2$, $AgZnInS_x$, and $CuInS_2$. The quantum dots may be sealed in spherical glass or a light-transmissive inorganic compound.

The light-transmissive member 40 may be a sintered body of a fluorescent material and an inorganic material (for example, alumina) or a plate-like crystal of a fluorescent material.

Base Material

Specific examples of the base material of the light-transmissive member 40 (41, 44, 45) include silicone resin, epoxy resin, phenol resin, polycarbonate resin, acrylic resin, TPX resin, polynorbonene resin, or modified resin thereof or hybrid resin thereof. For the filler material, one of the above may be used alone or two or more of the above may be used in combination. Among those, silicone resin, modified resin thereof, and hybrid resin thereof are preferable because they have good heat-resisting properties and light-resisting properties.

The light-transmissive member 40 may either be a single layer or have a layered structure. In the case of a layered structure, layers containing different fluorescent materials and/or different base materials may be employed, or a layer of base material that does not contain a fluorescent material may be layered, or a layer containing a light diffusing material instead of a fluorescent material may be layered. The layer of a base material that does not contain a fluorescent material or the layer containing a light diffusing material instead of a fluorescent material is preferably arranged in the light-transmissive member 40 at a location distal to the light emitting element 20. With this, the heat-resisting properties and the light-resisting properties, etc., of the light-transmissive member 40 can be improved irrespective of the type of the fluorescent material.

Examples of the light diffusing material that can be contained in the light-transmissive member 40 include particles of an inorganic material such as barium titanate, titanium oxide, aluminum oxide, silicon oxide, calcium carbonate, particles of an organic material such as a silicone resin, an acrylic resin, and glass powder (preferably refractive index adjusted glass power). Those can be used alone or two or more of the above can be used in combination.

The light-transmissive member 40 preferably has a size covering the outline of the light emitting element(s) 20 in a top view. This arrangement can facilitate an increase in the luminous region of the light emitting device, and thus can facilitate an increase in the light extraction efficiency.

Light-Reflecting Member 50

For example, the light-reflecting member 50 includes a base material, and preferably also includes a light-reflecting material. Specific examples of the base material of the light-reflecting member 50 include silicone resin, epoxy resin, phenol resin, polycarbonate resin, acrylic resin, or modified resin thereof or hybrid resin thereof. Of those, silicone resin or modified resin or hybrid resin thereof has high heat-resisting properties and high light-resisting properties, and therefore preferable.

Examples of the light-reflecting material include while pigments such as titanium oxide, zinc oxide, magnesium oxide, carbonate magnesium, magnesium hydroxide, calcium carbonate, calcium hydroxide, calcium silicate, magnesium silicate, barium titanate, barium sulfate, aluminum hydroxide, aluminum oxide, and zirconium oxide. One of the above may be used alone or two or more of the above may be used in combination.

In view of fluidity, a white pigment of an approximately spherical shape is preferable. In view of improvement in reflecting light and in covering effect, the white pigment may have a primary particle size (for example, represented by $D_{50}$) in a range of 0.1 to 0.5 μm. The content of the light-reflecting material in the light-reflecting member 50 is, in view of the light-reflecting properties, the viscosity in flowable state, etc., preferably in a range of 10 to 70 wt %, more preferably in a range of 30 to 60 wt %.

The light emitting device of the present invention can be used for backlight light sources of liquid crystal displays, various kinds of lighting fixtures, and various kinds of display devices such as large displays, advertisements and destination guides, and image reading devices in digital video cameras, facsimiles, copiers, scanners and the like, and projector devices.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A method of manufacturing a light emitting device comprising:
   mounting at least one light emitting element on a support member with a first surface of the light emitting element facing upward;
   applying an adhesive to the first surface of the light emitting element by holding the support member and dipping the first surface of the light emitting element in the adhesive;
   disposing a light-transmissive member on the first surface of the light emitting element via the adhesive;
   curing the adhesive to fix the light emitting element and the light-transmissive member;
   removing the support member from the light emitting element; and disposing a light-reflecting member around the light emitting element.

2. The method of manufacturing a light emitting device according to claim 1, wherein
the light-transmissive member contains a fluorescent material.

3. The method of manufacturing a light emitting device according to claim 1, further comprising
covering lateral surfaces of the light emitting element by the adhesive.

4. The method of manufacturing a light emitting device according to claim 1, wherein
the disposing of the light-reflecting member includes disposing the light-reflecting member on a second surface which is opposite from the first surface of the light emitting element.

5. The method of manufacturing a light emitting device according to claim 1, wherein
the disposing of the light-reflecting member includes disposing the light-reflecting member around the light-transmissive member in addition to around the light emitting element.

6. The method of manufacturing a light emitting device according to claim 1, wherein
the light-reflecting member includes a resin and a light-reflecting material.

7. The method of manufacturing a light emitting device according to claim 1, further comprising
singulating by the at least one light emitting element or by each group including a plurality of light emitting elements corresponding to a plurality of light emitting devices after the disposing of the light-reflecting member.

8. The method of manufacturing a light emitting device according to claim 1, wherein
the mounting of the at least one light emitting element includes electrically connecting the light emitting element to a wiring substrate.

9. A method of manufacturing a light emitting device comprising:
mounting a plurality of light emitting elements on a support member with a first surface of each of the plurality of the light emitting elements facing upward;
applying an adhesive to all the first surface of each of the light emitting elements at once;
disposing a light-transmissive member on the first surface of each of the plurality of the light emitting elements via the adhesive;
curing the adhesive on the plurality of the light emitting elements to fix each of the plurality of the light emitting elements and the light-transmissive member;
removing the support member from the plurality of the light emitting elements; and
disposing a light-reflecting member around each of the plurality of the light emitting elements.

10. The method of manufacturing a light emitting device according to claim 9, wherein
the light-transmissive member contains a fluorescent material.

11. The method of manufacturing a light emitting device according to claim 9, further comprising
covering lateral surfaces of each of the plurality of the light emitting elements by the adhesive.

12. The method of manufacturing a light emitting device according to claim 9, wherein
the disposing of the light-reflecting member includes disposing the light-reflecting member on a second surface which is opposite from the first surface of each of the plurality of light emitting elements.

13. The method of manufacturing a light emitting device according to claim 9, wherein
the disposing of the light-reflecting member includes disposing the light-reflecting member around the light-transmissive member in addition to around each of the plurality of light emitting elements.

14. The method of manufacturing a light emitting device according to claim 9, wherein
the light-reflecting member includes a resin and a light-reflecting material.

15. The method of manufacturing a light emitting device according to claim 9, further comprising
singulating by each of the light emitting elements or by each group including a plurality of the light emitting elements corresponding to a plurality of light emitting devices after the disposing of the light-reflecting member.

16. The method of manufacturing a light emitting device according to claim 9, wherein
the mounting of the plurality of the light emitting elements includes electrically connecting the plurality of the light emitting elements to a wiring substrate.

* * * * *